United States Patent
Wisler

(10) Patent No.: US 7,164,266 B2
(45) Date of Patent: Jan. 16, 2007

(54) NUCLEAR MAGNETIC RESONANCE TOOL WITH CONDUCTIVE AND NON-CONDUCTIVE MAGNET ASSEMBLY

(75) Inventor: MacMillan Wisler, Kingwood, TX (US)

(73) Assignee: Precision Energy Services, Inc., Houston, TX (US)

( * ) Notice: Subject to any disclaimer, the term of this patent is extended or adjusted under 35 U.S.C. 154(b) by 0 days.

(21) Appl. No.: 10/385,388

(22) Filed: Mar. 7, 2003

(65) Prior Publication Data

US 2004/0174166 A1 Sep. 9, 2004

(51) Int. Cl.
*G01V 3/00* (2006.01)
(52) U.S. Cl. ..................... 324/303
(58) Field of Classification Search .......... None
See application file for complete search history.

(56) References Cited

U.S. PATENT DOCUMENTS

| | | | |
|---|---|---|---|
| 4,710,713 A | 12/1987 | Towle | |
| 5,138,263 A | 8/1992 | Towle | |
| 5,557,201 A * | 9/1996 | Kleinberg et al. | 324/303 |
| 5,757,186 A * | 5/1998 | Taicher et al. | 324/303 |
| 5,767,674 A * | 6/1998 | Griffin et al. | 324/303 |
| 5,977,768 A * | 11/1999 | Sezginer et al. | 324/303 |
| 6,163,151 A * | 12/2000 | Wisler et al. | 324/303 |
| 6,268,726 B1 | 7/2001 | Prammer et al. | |
| 6,326,784 B1 * | 12/2001 | Ganesan et al. | 324/303 |
| 6,326,785 B1 * | 12/2001 | Kruspe | 324/303 |
| 6,362,619 B1 | 3/2002 | Prammer et al. | |
| 6,400,147 B1 * | 6/2002 | Toufaily et al. | 324/303 |
| 6,459,262 B1 * | 10/2002 | Wisler et al. | 324/303 |
| 2002/0033699 A1 | 3/2002 | Toufaily et al. | |

FOREIGN PATENT DOCUMENTS

WO   WO 02/057809 A1   7/2002

OTHER PUBLICATIONS

Carr et al., "Effects of Diffusion on Free Precision in Nuclear Magnetic Resonance Experiments." Physical Review, vol. 94, No. 3 (May 1, 1954), pp. 630-638.
Timur, A., "Pulsed Nuclear Magnetic Resonance Studies of Porosity. Movable Fluid and Permeability of Sandstones", Journal of Petrol Tech. Jun. 1969.

* cited by examiner

Primary Examiner—Diego Gutierrez
Assistant Examiner—Dixomara Vargas
(74) Attorney, Agent, or Firm—Patrick H. McCollum

(57) ABSTRACT

A nuclear magnetic resonance (NMR) logging system for measuring fluid properties of formation penetrated by a well borehole. The system uses a conductive permanent magnet to generate a field $H_0$. The conductive permanent magnet is disposed within a logging tool so that the $H_0$ field is perpendicular to the axis of the borehole. Soft ferrite elements are disposed on each pole of the permanent conductive magnet and a RF coil is disposed about both the permanent magnet and the ferrite. The resulting $H_1$ field induced by the RF coil is perpendicular to both the $H_0$ and the axis of the borehole. The soft ferrite elements focus the conductive permanent magnetic field and increase the effectiveness of the RF antenna. A two coil embodiment is disclosed that produces a combined RF field which is substantially perpendicular to the static magnetic field external to the conductive permanent magnet, and is contained within the soft ferrite elements in the vicinity of said conductive permanent magnet. Fluid properties of interest are determined from NMR relaxation times measured by the logging system.

41 Claims, 5 Drawing Sheets

NUCLEAR MAGNETIC RESONANCE TOOL WITH CONDUCTIVE AND NON-CONDUCTIVE MAGNET ASSEMBLY

This invention is related to nuclear magnetic resonance (NMR) measurement systems, and more particularly related to NMR systems for measuring fluid and pore properties of materials penetrated by a well borehole.

BACKGROUND OF THE INVENTION

Well borehole systems that measure properties of earth formation, as a function of depth along the borehole, are typically referred to as borehole "logging" systems. Although formation lithology, formation mechanical properties and borehole parameters are of interest in hydrocarbon production, fluid properties of formations penetrated by the borehole are typically primary parameters of interest. NMR logging systems respond primarily to fluid parameters of the formation. Other types of hydrocarbon borehole logging systems typically require independent determinations of other formation properties in order to obtain the desired formation fluid parameters.

NMR logging systems can be used to determine free fluid volume (FFV) contained in formation pore space, irreducible water saturation or bound fluid volume (BFV), formation porosity, formation permeability, and fluid type (e.g. oil or water). In the type of NMR logging system that this patent addresses proton spin alignment within the formation is induced magnetically by a strong permanent magnet. An RF coil is then pulsed perturb this alignment. These pulses create echos from the protons in the formation which are received by the same or another RF coil. The measured echos are used to determine one or both of two principle relaxation times $T_1$ and $T_2$. These relaxation times are in turn used to determine formation and formation fluid properties of interest.

NMR borehole instrumentation, typically referred to as a borehole logging "tool", can be conveyed along a borehole by means of a wireline, a production tubing string, or a borehole drill string. Tools conveyed by a drill string allow NMR measurements to be made while the borehole is being drilled. This technique, commonly known as logging-while-drilling (LWD) or measurement-while-drilling (MWD). Tools conveyed by a wireline or a string of production tubing allow NMR measurements to be made after the borehole is drilled. Each technique results in a variety of operational, economic and technical advantages and disadvantages, depending upon well location, well configuration, well conditions, apriori knowledge of the area being drilled and produced, and the like.

A typical NMR logging system comprises a borehole instrument that generates a static magnetic field $H_0$ in the borehole, with a direction of magnetization running primarily perpendicular to the axis of the borehole. The instrument employs a coil to generate an exciting radio frequency (RF) field $H_1$ in a direction essentially perpendicular to both the borehole axis and the static magnetic field $H_0$. The RF field is pulsed at a frequency, duration, and power level to cause the protons in the formation to precess about the H0 field and to cause a series of echos from the formation. These echos are received by the same or another RF coil and are translated by the computer circuitry to measurements of relaxation times T1 or T2. See for example Carr et al., "Effects of Diffusion on Free Precision in Nuclear Magnetic Resonance Experiments," Physical Review, vol. 94, No. 3 (May 1, 1954), pp. 630–638. These relaxation times are then converted to formation and fluid properties. See for example Timur, A., "Pulsed Nuclear Magnetic Resonance Studies of Porosity, Movable Fluid and Permeability of Sandstones", J. of Petrol Tech., June 1969.

The static magnetic field $H_0$ is preferably generated with a permanent magnet. The permanent magnet is either a conductive magnet made from rare earth elements such as samarium cobalt, or by a non-conductive magnet such as a hard ferrite magnet. Conductive magnets are stronger than hard non-conductive magnets of comparable size. Weaker non-conductive magnets produce a corresponding weaker $H_0$ field which translates to a lower signal to noise NMR measurement. Conductive properties of the stronger conductive magnet inhibit RF antenna gain by supporting eddy currents in the conductive magnetic body.

Instruments utilizing these basic concepts are disclosed in WO 02/057809 A1, and in U.S. Pat. Nos. 4,710,713, 6,268,726 B1, and 6,362,619 B2.

U.S. Pat. No. 4,710,713, which is incorporated herein by reference, discloses a wireline logging tool, which uses a cylindrical, non-conductive, permanent hard ferrite magnet to produce the static magnetic field $H_0$. A coil is disposed around the magnet whose turns are parallel to the magnetic field. The coil produces a RF field $H_1$ that is essentially perpendicular to the static field $H_0$. It is taught that it is essential for the permanent magnet material to be non-conductive. The RF field $H_1$ produced by the coil is therefore not obstructed by a conductive structure that would produce eddy currents, which would result in an unwanted reduction in the RF field strength. The advantages in the $H_1$ field are obtained at the expense using a weaker non-conductive magnet, which produces a corresponding weaker $H_0$ field.

U.S. Pat. Nos. 6,268,726 B1, and 6,362,619 B2 disclose MWD logging tools which use a conductive permanent magnet to generate a static $H_0$ field, and use ferrite to reduce the effects on an RF antenna on a conductive drilling collar in which the tool is housed. Ferrite is not used to reduce adverse effects of the RF antenna on the conductive permanent magnet. These references also disclose auxiliary coils in addition to the RF antenna coil. Auxiliary coils are used as a field monitor in a feedback calibration circuit.

WO 02/057809 A1 discloses a system employing a permanent conductive magnet to generate a static $H_0$ field, and an RF coil to generate an essentially perpendicular $H_1$ field. An additional RF coil is disposed in the magnet-coil assembly to cancel the RF field in the vicinity of the conductive magnet body thereby minimizing eddy currents within the body of the magnetic. The additional coil, however, effectively reduces the magnetic moment of the $H_1$ coil by the area of the conductive area cross section, again translating into a lower RF field in the formation penetrated by the well borehole. The lower RF field in the formation results, in turn, in a lower signal to noise NMR signal measurement from the system with a corresponding reduction in precision in measures of parameters of interest.

EMBODIMENTS OF THE INVENTION

1. Overview

The present invention is a NMR measurement system that uses an elongated permanent magnet that is magnetized in a direction perpendicular to the borehole axis and the long axis of the magnet. The system also has at least one coil whose turns lie substantially parallel to the magnetization direction of the permanent magnet. The Permanent magnet produces a static magnetic field $H_0$ substantially perpendicular to the axis of the borehole. The coil produces a radio frequency (RF) field $H_1$ that is substantially perpendicular to both the borehole axis and to the static field. The coil also preferably serves as an antenna to receive NMR signals.

The present invention uses a conductive permanent magnet to generate the static field $H_0$. The conductive permanent magnet is disposed in a magnet-coil assembly within a logging tool, with poles of the permanent magnet oriented perpendicular to the major axis of the logging tool. The $H_0$ field is therefore essentially perpendicular to the axis of the borehole.

The magnet-coil assembly of the present invention comprises soft ferrite elements that are disposed in close proximity to the pole faces of the conductive permanent magnet. In one embodiment the RF coil is wound around the outside of the permanent magnet and the soft ferrite elements. The soft ferrite serves to conduct and focus the static permanent magnet field to the exterior of the tool and to conduct the RF field $H_1$ perpendicular to the static field $H_0$. Eddy currents are thus reduced in the body of the conductive permanent magnet and the $H_0$ field is enhanced. The soft ferrite elements thereby allow the use a strong conductive permanent magnet, such as SmCo, instead of a much weaker hard ferrite magnet. The ferrite elements also enhance the effective coil area and produce a much stronger RF field $H_1$. The stronger fields can be used to enhance the signal to noise ratio of the measurement system, and thus increase the measurement accuracy of a logging tool of equivalent size. Other advantages of the present invention are that the logging tool can be made smaller, and can also be made to obtain deeper radial measurements into earth formation penetrated by the well borehole.

2. Borehole System

Figure 1:
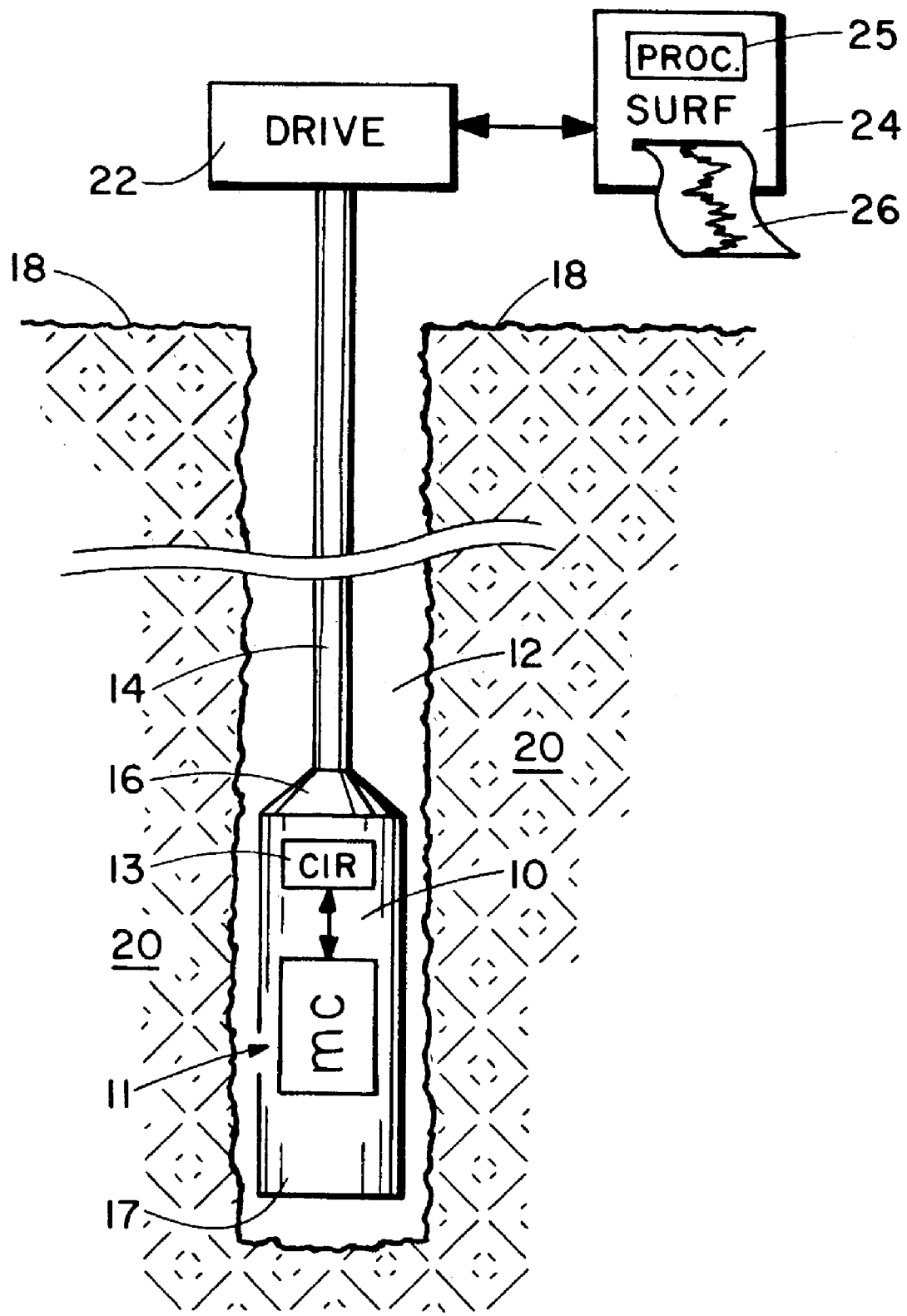
FIG. 1 shows a NMR logging system with a logging tool comprising a magnet-coil assembly deployed within a well borehole.

FIG. 1 shows a NMR logging system deployed within a well borehole 12 penetrating earth formation 20. A NMR borehole tool 10 is operationally attached to a downhole end of a conveyance means 14 using a head assembly 16. Elements of the tool are conveyed in a nonconductive and nonmagnetic housing 17. An uphole end of the conveyance means 14 is operationally attached to a driver means 22 disposed at the surface 18 of the earth. The conveyance means 14 can be a cable such as a wireline or slick line, a string of production tubing, or a drill string with the cooperating driver means 22 being a winch assembly, a coiled tubing injector, or a rotary drilling rig, respectfully.

Still referring to FIG. 1, a magnet-coil assembly 11 comprising a conductive permanent magnet and at least one coil is disposed within the logging tool 10. The magnet-coil assembly 11 generates previously discussed magnetic fields $H_0$ and $H_1$, and will be discussed in detail in the following sections of this disclosure. Circuitry 13 cooperates with the magnet-coil assembly 11 to control operation of the assembly and to contribute in the measure of NMR relaxation times generated by the $H_0$ and $H_1$ fields. The circuitry 13 will be described in more detail in a subsequent section of this disclosure. The magnet-coil assembly 11 is designed to be disposed in the tool 10 so that it is exposed to downhole pressures encountered within the borehole 12.

Again referring to FIG. 1, surface equipment 24, comprising a surface processor 25, is operationally connected to the driving means 22 to receive and optionally process data measured by the NMR logging tool 10. Data processing with the surface processor 25 typically includes the conversion of the formation echos to spectra of two principle relaxation times $T_1$ and $T_2$ preferably measured by circuitry 13 within the tool 10 into formation and formation fluid parameters of interest including FFV, BFV, formation porosity, formation permeability, and fluid type. One or more of these parameters of interest are recorded as a function of dept in the borehole 12 thereby forming a log 26 of the one or more parameters of interest. The log 26 can be in the form of an analog display, a numerical tabulation, a two or three dimensional image, or a digital record contained in a suitable recording and storage device (not shown) preferably disposed within the surface unit 24. Alternately, data can be recorded and stored with a suitable recording means (not shown) disposed within the logging tool 10 for subsequent transfer to the surface unit 24 for additional processing, recording and display.

3. Prior Art Magnet-Coil Assembly

Figure 2:
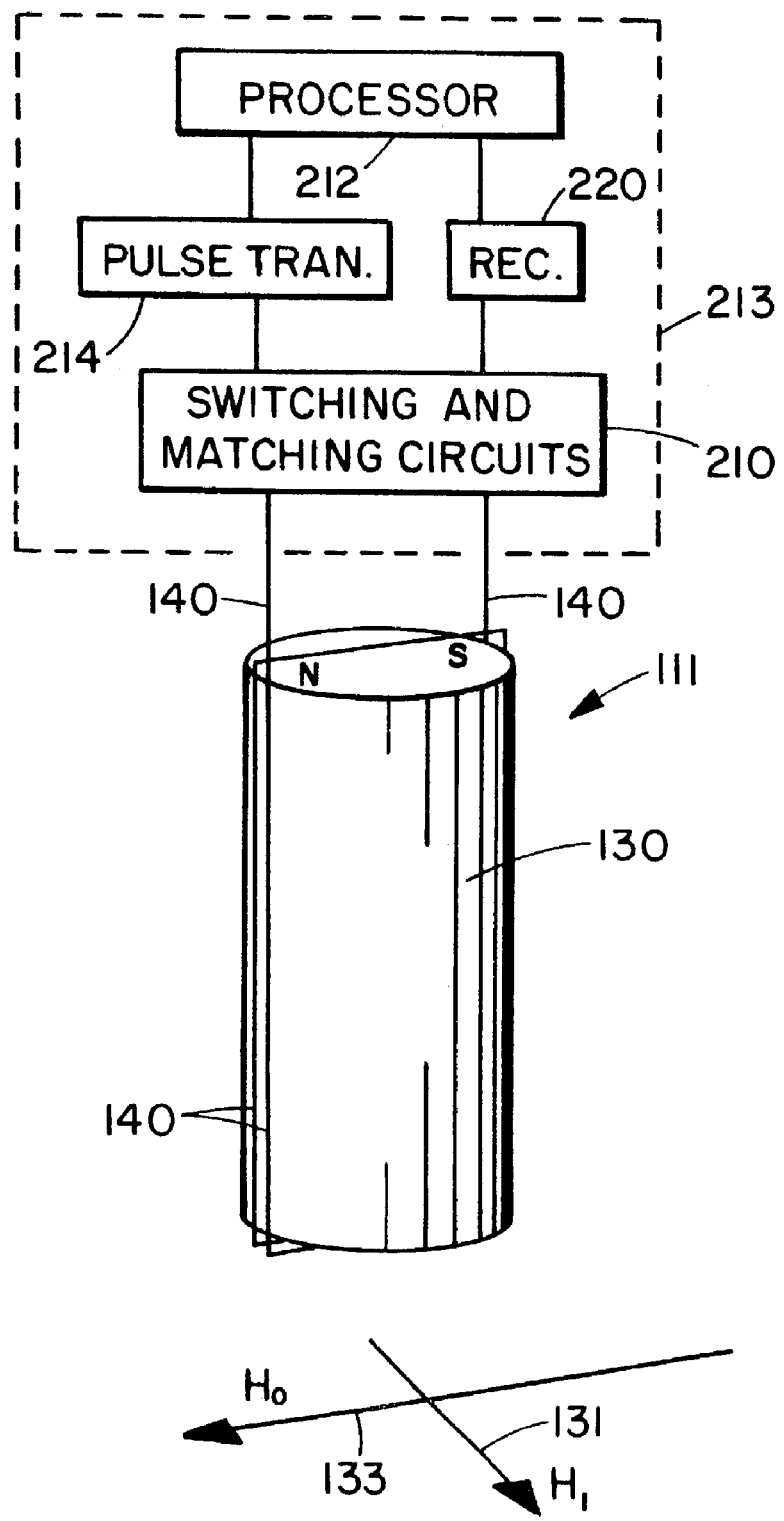
FIG. 2 is a prior art magnet-coil assembly comprising a permanent magnet and a coil.

FIG. 2 shows a perspective view of a prior art single coil NMR magnet-coil assembly 111. A conductive permanent magnet 130 is shown oriented so the south and north poles and produce a static magnetic field $H_0$ illustrated conceptually with the arrow 133. A RF coil with windings 140 is oriented with respect to the conductive permanent magnet 130 to produce a field $H_1$ that is illustrated conceptually with the arrow 132. The magnet-coil assembly 111 is controlled by circuitry identified as a whole by the numeral 213. The circuitry 213 comprises switching and matching circuits 210 which operate the coil both as a source for the RF field $H_1$ and as a receiver antenna for NMR signals induced by the assembly. A pulse transmitter 214 cooperates with the switching and matching circuits 210 to provide a pulsed RF field for the NMR measurements. A receiver 220 cooperates with the switching and matching circuits 210 to receive induced NMR echo signals when the coil 140 is functioning as an antenna. The pulse transmitter 214 and receiver 220 are under the control of a processor 212 which has been preprogrammed with the desired system operation and measurement specifications. The induced fields $H_0$ and $H_1$ are perpendicular, with both being perpendicular to the major axis of the conductive permanent magnet 130.

4. Magnet-Coil Assembly with Ferrite Elements and Single Coil

Figure 3:
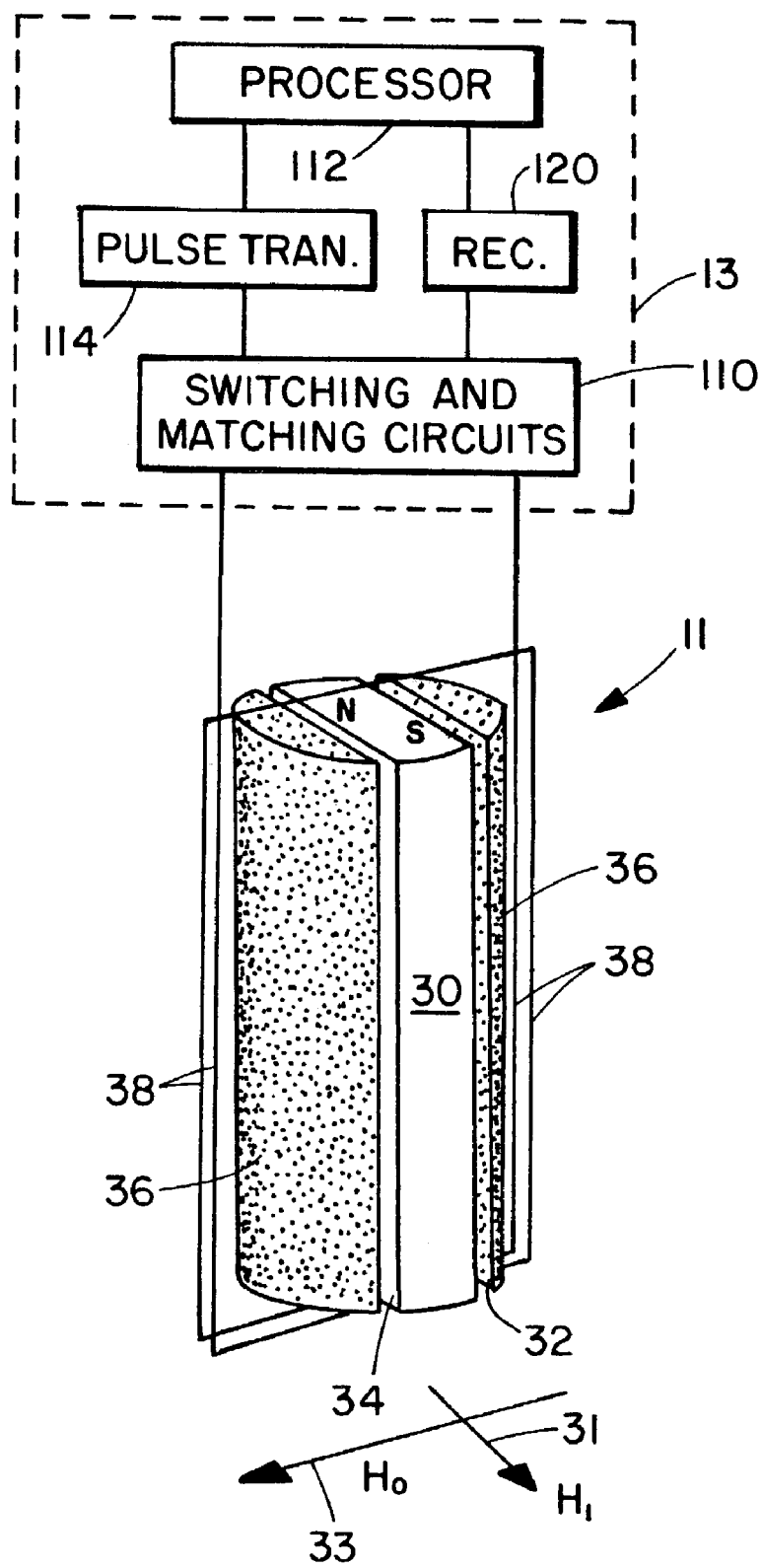
FIG. 3 is an illustration of a magnet-coil assembly comprising a conductive permanent magnet, soft ferrite elements in proximity with poles of the conductive permanent magnet, and a single coil.

FIG. 3 shows a perspective view of single coil magnet-coil assembly 11 of the present system configured for a NMR logging tool 10 as shown in FIG. 1. A conductive permanent magnet 30 is oriented so the south and north poles 32 and 34, respectively, produce a static magnetic field $H_0$ illustrated conceptually with the arrow 33. An RF coil antenna with windings 38 is oriented with respect to the conductive permanent magnet 30 to produce a field $H_1$, which is illustrated conceptually with the arrow 32. The induced fields $H_0$ and $H_1$ are essentially perpendicular, with both fields being essentially perpendicular to the major axis of the conductive permanent magnet 30.

Again referring to FIG. 3, soft ferrite elements 36 are disposed between the coil windings 38 in close proximity to the pole faces 32 and 34 of the conductive permanent magnet 30. The elements 36 are preferably cylindrical with approximate semicircular cross sections. The flat sides of the elements 36 match the pole faces 32 and 34. A gap is shown between the elements 36 and the conductive permanent magnet 30 for purposes of illustration. Preferably, the flat sides of the elements 36 directly contact the respective pole faces 32 and 34 of the conductive permanent magnet 30. Owing to the high magnet permeability of the soft ferrite elements 36, the field $H_1$ is enhanced significantly. Also, owing to the high magnetic permeability of the soft ferrite elements 36, eddy currents induced by the RF antenna coil 38 within the body of the conductive permanent magnet 30 are essentially eliminated. The elements 36 significantly increase the strength of the conductive permanent magnet for a given physical dimension without the use of a second RF coil to cancel the RF field in the vicinity of the conductive magnet body.

Still referring to FIG. 3, the magnet-coil assembly 11 is controlled by circuitry 13. The circuitry 13 comprises switching and matching circuits 110 which operate the coil 38 both as a source for the RF field $H_1$ and as a receiver antenna for NMR signals induced in the formation by the assembly. A pulse transmitter 114 cooperates with the switching and matching circuits 110 to provide a pulsed RF field for the NMR measurements obtained by the logging system illustrated in FIG. 1. A receiver 120 cooperates with the switching and matching circuits 110 to receive induced NMR signals when the coil 38 is functioning as a receiving antenna. The pulse transmitter 114 and receiver 120 are under the control of a processor 112 which has been preprogrammed with the desired system operation and measurement specifications.

In summary, the soft ferrite elements 36 as shown in FIG. 3 focus the conductive permanent magnetic field, eliminate eddy currents within the body of the conductive permanent magnet 30 thereby enhancing the static field, and increase the effectiveness of the RF coil antenna 38.

5. Magnet-Coil Assembly with Ferrite Elements and Two Coils

Figure 4:
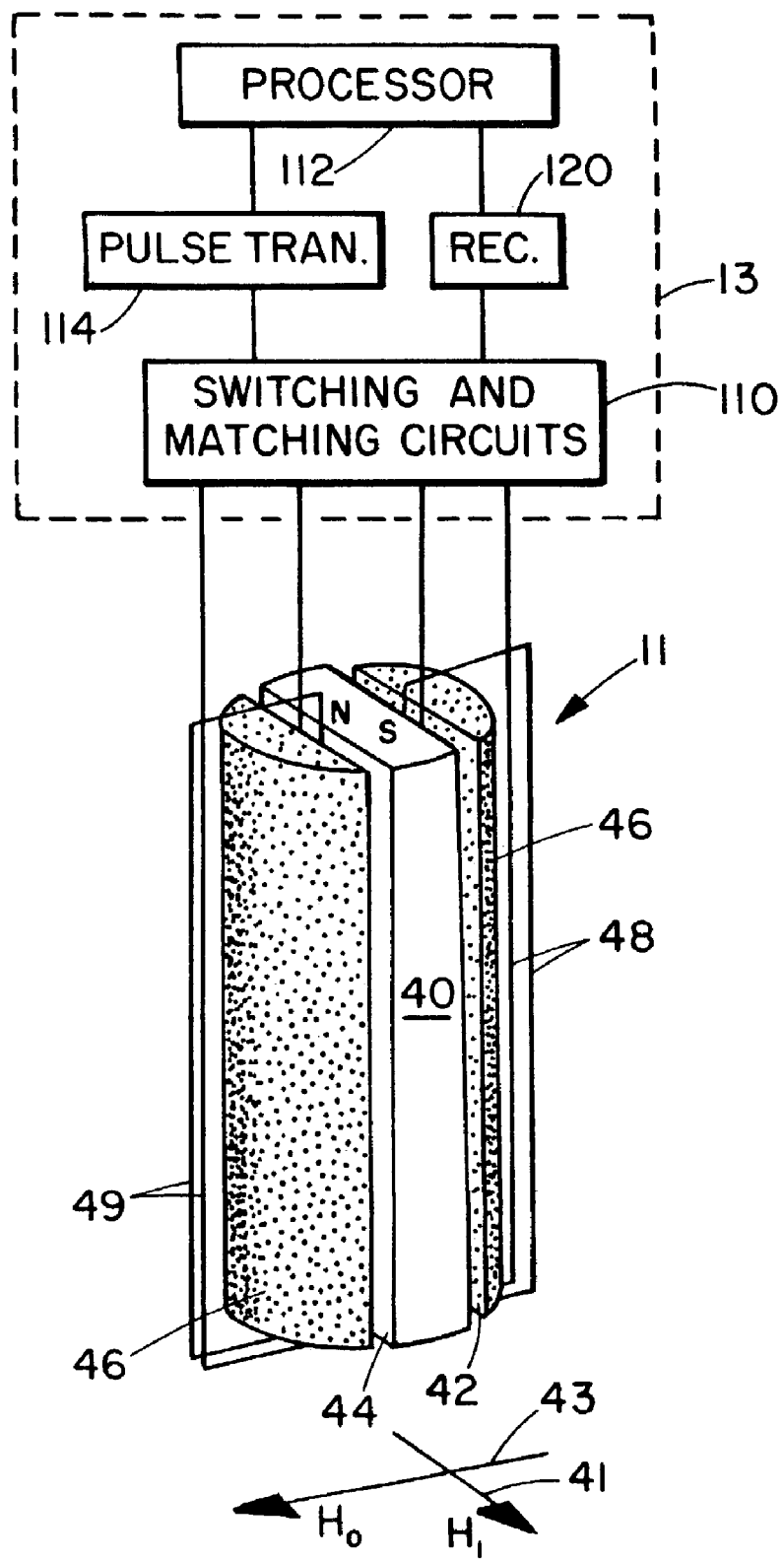
FIG. 4 is an illustration of a magnet-coil assembly comprising a conductive permanent magnet, soft ferrite elements and two coils.

FIG. 4 shows a perspective view of two coil magnet-coil assembly 11 of the present system, again configured for an NMR logging tool 10 as shown in FIG. 1. A conductive permanent magnet 40 is oriented so the south and north poles 42 and 44, respectively, produce a static magnetic field $H_0$ illustrated conceptually with the arrow 43. Soft ferrite elements 46 are disposed in close proximity to the pole faces 42 and 44 of the conductive permanent magnet 40. As in the single coil embodiment, the elements 46 are preferably cylindrical with approximate semicircular cross sections, with the flat sides of the elements match the pole faces 42 and 44.

Again referring to FIG. 4, two coils with windings 48 and 49 are disposed around each of the soft ferrite elements 46 as illustrated. The coils are matched to produce a combined RF field $H_1$ illustrated conceptually by the arrow 41. The combined RF field $H_1$ is substantially perpendicular to the static magnetic field $H_0$ external to the conductive permanent magnet 40, and contained within the soft ferrite elements 46 in the vicinity of the conductive permanent magnet.

As discussed previously in the single coil magnet-coil assembly embodiment, the two coil magnet-coil assembly 11 is controlled by the circuitry 13 as shown in FIG. 4. The switching and matching circuits 110 operationally match the coils 48 and 49 to produce the combined RF field $H_1$, which is substantially perpendicular to the static magnetic field $H_0$ external to the conductive permanent magnet 40, and contained within the soft ferrite elements 46 in the vicinity of the conductive permanent magnet. Again, the pulse transmitter 114 cooperates with the switching and matching circuits 110 to provide a pulsed combined RF field $H_1$. The receiver 120 cooperates with the switching and matching circuits 110 to receive induced NMR signals when at least one of the coils 48 and 49 is functioning as a receiver. The pulse transmitter 114 and receiver 120 are under the control of the processor 112 which has been preprogrammed with the desired coil balancing, system operation and measurement specifications.

Again referring to FIG. 4, the soft ferrite elements 46 are disposed between the in close proximity to the pole faces 42 and 44 of the conductive permanent magnet 40. The preferred shape is again cylindrical with approximate semicircular cross sections, and with flat sides matching the pole faces 42 and 44. A gap is again shown between the elements 46 and the conductive permanent magnet 40 for purposes of illustrating disposition of the coil windings 48 and 49. The gap can be used as a path for the windings. Preferably, the elements 46 directly contact the respective pole faces 42 and 44 of the conductive permanent magnet 40, with the windings 48 and 49 being routed at the interfaces in suitable groves in the elements 46, in the magnet 40, or aligned groves in both the elements and the magnet.

The two matched coils cooperating with the ferrite elements effectively eliminate eddy currents induced by the RF field both within the body of the conductive permanent magnet 40 and at the pole faces 42 and 44 of the conductive permanent magnet. This enhances both the $H_0$ and $H_1$ fields.

6. Other Embodiments

Figure 5:
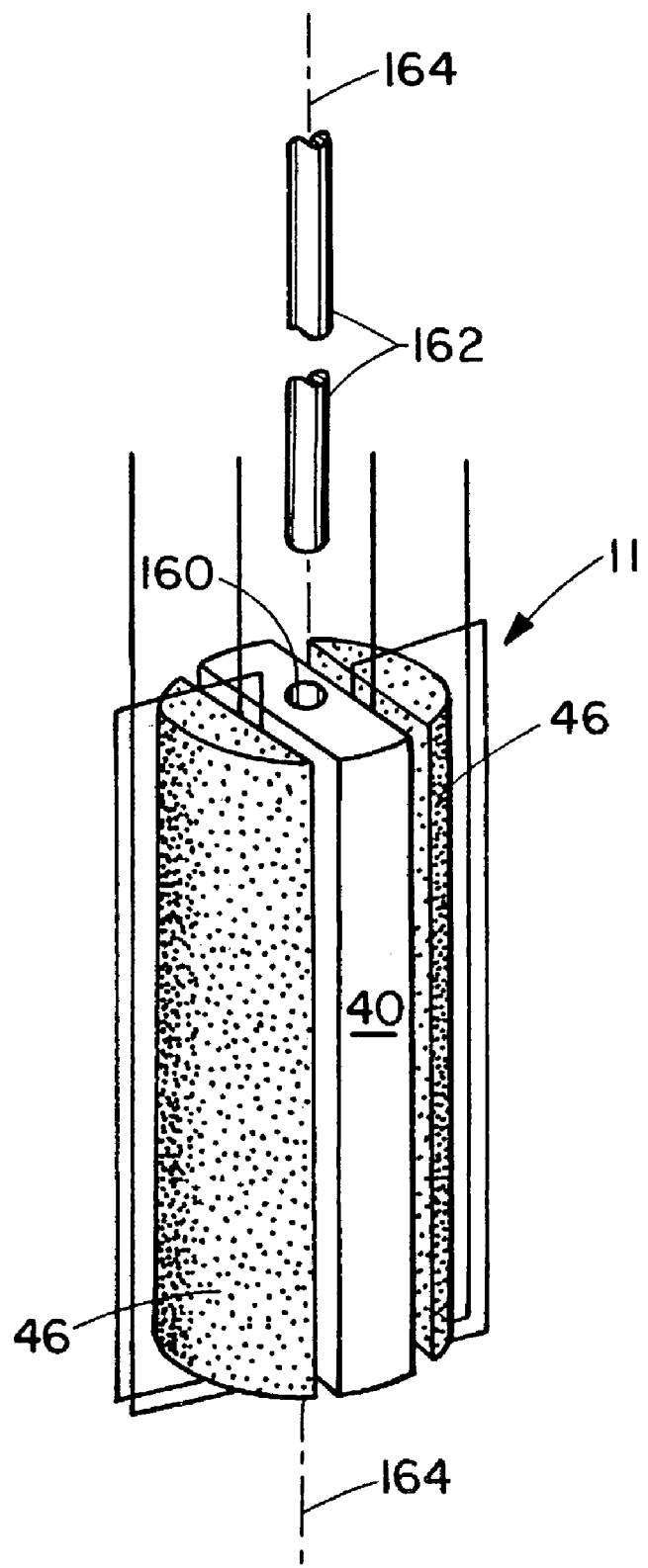
FIG. 5 is an illustration of a magnet-coil assembly with a conduit through the conductive permanent magnet, wherein the conduit is used to receive a structural rod member which attaches the magnet-coil assembly to other elements of a logging tool.

FIG. 5 illustrates a two-coil magnet-coil assembly 11 with a conduit 160 passing through the conductive permanent magnet 40. A nonmagnetic rod 162 is shown as being insertable into the conduit 160 along a path 164. The rod can be used for purposes such as structurally attaching the magnet-coil assembly 11 other elements of the logging tool assembly 10 including the nonconductive and nonmagnetic housing 17. The conduit 160 and rod 162 do not adversely affect the operation of either the two-coil assembly embodiment, or the one coil embodiment discussed previously and shown in FIG. 3.

One skilled in the art will appreciate that the present invention can be practiced by other than the described embodiments, which are presented for purposes of illustration and not limitation, and the present invention is limited only by the claims that follow.

What is claimed is:

1. A nuclear magnetic resonance logging system comprising a conductive permanent magnet functioning with minimized induced eddy currents therein, the system comprising:

(a) a tool;

(b) conveyance means with a downhole end and an uphole end wherein said downhole end is operationally attached to said tool;
(c) driver means disposed at the surface of the earth and operationally attached to said uphole end of said conveyance means; and
(d) a magnet-coil assembly disposed within said tool and comprising
  (i) said conductive permanent magnet producing a static magnetic field,
  (ii) at least one RF coil oriented to produce a RF magnetic field essentially perpendicular to said static magnetic field, and
  (iii) soft ferrite elements so disposed with said at least one RF coil and said conductive permanent magnetic to minimize said eddy currents induced within said conductive permanent magnet by said RF magnetic field.

2. The logging system of claim 1 wherein:
(a) one said coil encompassing said conductive permanent magnet and is oriented to produce said RF magnetic field essentially perpendicular to said static magnetic field; and
(b) said soft ferrite elements are disposed between said coil and pole faces of said conductive permanent magnetic to minimize eddy currents generated within said conductive permanent magnet by said RF magnetic field.

3. The logging system of claim 2 wherein a said soft ferrite element is disposed in direct contact with each said pole face.

4. The logging system of claim 1 comprising two coils with a coil disposed around each said soft ferrite insert wherein:
(a) a said soft ferrite element is disposed at close proximity to each pole face of said conductive permanent magnet; and
(b) said coils are oriented to produce a combined RF field that is
  (i) substantially perpendicular to said static magnetic field external to said conductive permanent magnet, and
  (ii) contained within said soft ferrite elements in the vicinity of said conductive permanent magnet.

5. The logging system of claim 1 further comprising a surface unit operationally connected to said driver means to convert nuclear magnetic resonance relaxation time measured by said tool into an earth formation parameter of interest.

6. The logging system of claim 1 wherein said conveyance means is a wireline and said driver means is a winch.

7. The logging system of claim 1 wherein said conveyance means is a production tubing string and said driver means is a tubing injector.

8. The logging system of claim 1 wherein said conveyance means is a drill string and said driver means is a rotary drilling rig.

9. A nuclear magnetic resonance logging system comprising:
(a) a tool;
(b) conveyance means with a downhole end and an uphole end wherein said downhole end is operationally attached to said tool;
(c) driver means disposed at the surface of the earth and operationally attached to said uphole end of said conveyance means; and
(d) a magnet-coil assembly disposed within said tool and comprising
  (i) a conductive permanent magnet producing a static magnetic field,
  (ii) at least one RF coil oriented to produce a RF magnetic field essentially perpendicular to said static magnetic field, and
  (iii) soft ferrite elements cooperating with said at least one RF coil and said conductive permanent magnetic to minimize eddy currents induced within said conductive permanent magnet by said RF magnetic field, wherein
  (iv) a said coil is disposed around each said soft ferrite elements,
  (v) a said soft ferrite element is disposed in direct contact with each pole face of said conductive permanent magnet,
  (vi) said coils are oriented to produce a combined RF field that is
    substantially perpendicular to said static magnetic field external to said conductive permanent magnet, and
    contained within said soft ferrite elements in the vicinity of said conductive permanent magnet.

10. The logging system of claim 9 further comprising a nonmagnetic rod disposed within a conduit within said conductive permanent magnet, wherein said rod structurally attaches said magnet-coil assembly to other elements of said tool.

11. The logging system of claim 9 further comprising a surface unit operationally connected to said driver means to convert nuclear magnetic resonance relaxation time measured by said tool into an earth formation parameter of interest.

12. The logging system of claim 9 wherein said conveyance means is a wireline and said driver means is a winch.

13. The logging system of claim 9 wherein said conveyance means is a production tubing string and said driver means is a tubing injector.

14. The logging system of claim 9 wherein said conveyance means is a drill string and said driver means is a rotary drilling rig.

15. A method for determining a fluid property of formation penetrated by a borehole while minimizing eddy currents induced within a conductive permanent magnet used in said determination, the method comprising:
(a) providing a tool;
(b) conveying said tool within said borehole with a conveyance means, wherein
  (i) said conveyance means comprises a downhole end and an uphole end, and
  (ii) said downhole end is operationally attached to said tool;
(c) disposing a driver means at the surface of the earth and operationally attaching said driver means to said uphole end of said conveyance means;
(d) disposing a magnet-coil assembly within said tool, wherein said magnet-coil assembly comprises
  (i) said conductive permanent magnet producing a static magnetic field,
  (ii) at least one RF coil oriented to produce a RF magnetic field essentially perpendicular to said static magnetic field, and
  (iii) soft ferrite elements so disposed to cooperate with said at least one RF coil and said conductive permanent magnetic to minimize eddy currents generated within said conductive permanent magnet by said RF magnetic field;
(e) measuring a NMR relaxation time induced within said formation by said static magnetic field and said RF magnetic field essentially perpendicular to said static magnetic field; and
(f) converting said measured relaxation time into a measure of said fluid property.

16. The method of claim 15 wherein:
(a) one said coil encompasses said conductive permanent magnet and is oriented to produce said RF magnetic field essentially perpendicular to said static magnetic field; and
(b) one of said soft ferrite elements is disposed between said coil and each pole face of said conductive permanent magnetic to minimize eddy currents generated within said conductive permanent magnet by said RF magnetic field.

17. The method of claim 16 comprising the additional step of contacting each said pole face with a said soft ferrite element.

18. The method of claim 15 wherein:
(a) a said soft ferrite element is disposed at close proximity to each pole face of said conductive permanent magnet;
(b) a coil is disposed around each said soft ferrite insert; and
(c) said coils are oriented to produce a combined RF field that is
(i) substantially perpendicular to said static magnetic field external to said conductive permanent magnet, and
(ii) contained within said soft ferrite elements in the vicinity of said conductive permanent magnet.

19. The method of claim 15 further comprising converting said measured relaxation time into said fluid property in a surface unit operationally connected to said driver means.

20. The method of claim 15 wherein said conveyance means is a wireline and said driver means is a winch.

21. The method of claim 15 wherein said conveyance means is a production tubing string and said driver means is a tubing injector.

22. The method of claim 15 wherein said conveyance means is a drill string and said driver means is a rotary drilling rig.

23. A method for determining a fluid property of formation penetrated by a borehole, the method comprising:
(a) providing a tool;
(b) conveying said tool in said borehole with a conveyance means, wherein
(i) said conveyance means comprises a downhole end and an uphole end, and
(ii) said downhole end is operationally attached to said tool;
(c) disposing a driver means at the surface of the earth and operationally attached to said uphole end of said conveyance means; and
(d) disposing a magnet-coil assembly within said tool, wherein said magnet-coil assembly comprises
(i) a conductive permanent magnet producing a static magnetic field,
(ii) at least one RF coil oriented to produce a RF magnetic field essentially perpendicular to said static magnetic field, and
(iii) soft ferrite elements cooperating with said at least one RF coil and said conductive permanent magnetic to minimize eddy currents induced within said conductive permanent magnet by said RF magnetic field, wherein
(iv) a said coil is disposed around each said soft ferrite elements,
(v) a said soft ferrite element is disposed in direct contact with each pole face of said conductive permanent magnet,
(vi) said coils are oriented to produce a combined RF field that is
substantially perpendicular to said static magnetic field external to said conductive permanent magnet, and
contained within said soft ferrite elements in the vicinity of said conductive permanent magnet.

24. The method of claim 23 further comprising converting said measured relaxation time into said fluid property in a surface unit operationally connected to said driver means.

25. The method of claim 23 further comprising disposing a nonmagnetic rod within a conduit within said conductive permanent magnet, wherein said rod structurally attaches said magnet-coil assembly to other elements of said tool.

26. The method of claim 23 wherein said conveyance means is a wireline and said driver means is a winch.

27. The method of claim 23 wherein said conveyance means is a production tubing string and said driver means is a tubing injector.

28. The method of claim 23 wherein said conveyance means is a drill string and said driver means is a rotary drilling rig.

29. A borehole logging system for measuring a fluid parameter of interest using a conductive permanent magnet functioning with minimized induced eddy currents therein, the system comprising:
(a) a magnet-coil assembly disposed within said tool and comprising
(i) said conductive permanent magnet producing a static magnetic field,
(ii) at least one RF coil oriented to produce a RF magnetic field essentially perpendicular to said static magnetic field, and
(iii) soft ferrite elements so disposed to cooperate with said at least one RF coil and said conductive permanent magnetic to minimize said eddy currents induced within said conductive permanent magnet by said RF magnetic field;
(b) circuitry for
(i) operating said at least one coil as a RF transmitter and a receiving antenna,
(ii) inducing nuclear magnetic resonance, and
(iii) measuring a nuclear magnetic resonance relaxation time resulting from operation of said magnet-coil assembly; and
(c) a processor for converting said measured nuclear magnetic resonance relaxation time into said fluid parameter of interest.

30. The borehole logging tool of claim 29 wherein:
(a) one said coil encompasses said conductive permanent magnet and is oriented to produce said RF magnetic field essentially perpendicular to said static magnetic field; and
(b) a said soft ferrite element is disposed between said coil and at each pole face of said conductive permanent magnetic to minimize eddy currents generated within said conductive permanent magnet by said RF magnetic field.

31. The borehole logging tool of claim 30 wherein a said soft ferrite elements are disposed in direct contact with each said pole face.

32. The borehole logging tool of claim 29 comprising two coils with a coil disposed around each said soft ferrite insert wherein:
   (a) a said soft ferrite element is disposed at close proximity to each pole face of said conductive permanent magnet; and
   (b) said coils are oriented to produce a combined RF field that is
      (i) substantially perpendicular to said static magnetic field external to said conductive permanent magnet, and
      (ii) contained within said soft ferrite elements in the vicinity of said conductive permanent magnet.

33. The borehole logging tool of claim 29 comprising a nonmagnetic rod disposed within a conduit within said conductive permanent magnet, wherein said rod structurally attaches said magnet-coil assembly to other elements of said borehole logging tool.

34. A borehole logging tool comprising:
   (a) a magnet-coil assembly disposed within said tool and comprising
      (i) a conductive permanent magnet producing a static magnetic field,
      (ii) at least one RF coil oriented to produce a RF magnetic field essentially perpendicular to said static magnetic field, and
      (iii) soft ferrite elements cooperating with said at least one RF coil and said conductive permanent magnetic to minimize eddy currents induced within said conductive permanent magnet by said RF magnetic field;
   (b) circuitry for
      (i) operating said at least one coil as a RF transmitter and a receiving antena,
      (ii) inducing nuclear magnetic resonance, and
      (iii) measuring a nuclear magnetic resonance relaxation time resulting from operation of said magnet-coil assembly; and
   (c) a processor for converting said measured nuclear magnetic resonance relaxation time into fluid parameter of interest; wherein
      (i) a said coil is disposed around each said soft ferrite insert,
      (ii) a said soft ferrite element is disposed in direct contact with each pole face of said conductive permanent magnet,
      (iii) said coils are oriented to produce a combined RF field that is
         substantially perpendicular to said static magnetic field external to said conductive permanent magnet, and
         contained within said soft ferrite elements in the vicinity of said conductive permanent magnet.

35. The borehole logging tool of claim 34 further comprising a nonmagnetic rod disposed within a conduit within said conductive permanent magnet, wherein said rod structurally attaches said magnet-coil assembly to other elements of said borehole logging tool.

36. A borehole logging method for determining a fluid parameter of interest using a conductive permanent magnet with minimized induced eddy currents therein, the method comprising:
   (a) disposing a magnet-coil assembly within said borehole, wherein said magnet-coil assembly comprises
      (i) said conductive permanent magnet producing a static magnetic field,
      (ii) at least one RF coil oriented to produce a RF magnetic field perpendicular to said static magnetic field, and
      (iii) soft ferrite elements so disposed to cooperate with said at least one RF coil and said conductive permanent magnetic to minimize said eddy currents induced within said conductive permanent magnet by said RF magnetic field;
   (b) with circuitry cooperating with said magnet-coil assembly,
      (i) operating said at least one coil as a RF transmitter and a receiving antenna,
      (ii) thereby inducing nuclear magnetic resonance, and
      (iii) measuring a nuclear magnetic resonance relaxation time resulting from said nuclear magnetic resonance; and
   (c) with a processor, converting said measured nuclear magnetic resonance relaxation time into said fluid parameter of interest.

37. The borehole logging method of claim 36 wherein:
   (a) one said coil encompasses said conductive permanent magnet and is oriented to produce said RF magnetic field essentially perpendicular to said static magnetic field; and
   (b) said soft ferrite elements are disposed between said coil and pole faces of said conductive permanent magnetic to minimize eddy currents generated within said conductive permanent magnet by said RF magnetic field.

38. The logging method of claim 37 comprising the additional step of disposing a said soft ferrite elements in direct contact with each said pole face.

39. The borehole logging method of claim 36 wherein:
   (a) said magnet-coil assembly comprises two coils with a coil disposed around each said soft ferrite insert;
   (b) a said soft ferrite element is disposed at close proximity to each pole face of said conductive permanent magnet; and
   (c) said coils are oriented to produce a combined RF field that is
      (i) substantially perpendicular to said static magnetic field external to said conductive permanent magnet, and
      (ii) contained within said soft ferrite elements in the vicinity of said conductive permanent magnet.

40. A borehole logging method comprising:
   (a) disposing a magnet-coil assembly within said borehole, wherein said magnet-coil assembly comprises
      (i) a conductive permanent magnet producing a static magnetic field,
      (ii) at least one RF coil oriented to produce a RF magnetic field perpendicular to said static magnetic field, and
      (iii) soft ferrite elements cooperating with said at least one RF coil and said conductive permanent magnetic to minimize eddy currents induced within said conductive permanent magnet by said RF magnetic field;
   (b) with circuitry cooperating with said magnet-coil assembly,
      (i) operating said at least one coil as a RF transmitter and a receiving antenna, (ii) thereby inducing nuclear magnetic resonance, and
(iii) measuring a nuclear magnetic resonance relaxation time resulting from said nuclear magnetic resonance; and
(c) with a processor, converting said measured nuclear magnetic resonance relaxation time into fluid parameter of interest; wherein
(d) said magnet-coil assembly comprises two coils with a coil disposed around each said soft ferrite insert;
(e) a said soft ferrite element is disposed in direct contact with each pole face of said conductive permanent magnet; and
(f) said coils are oriented to produce a combined RF field that is
  (i) substantially perpendicular to said static magnetic field external to said conductive permanent magnet, and
  (ii) contained within said soft ferrite elements in the vicinity of said conductive permanent magnet.

41. The method of claim 40 comprising a nonmagnetic rod disposed within a conduit within said conductive permanent magnet.

* * * * *